(12) United States Patent
Hayashi et al.

(10) Patent No.: US 6,413,883 B1
(45) Date of Patent: *Jul. 2, 2002

(54) METHOD OF LIQUID DEPOSITION BY SELECTION OF LIQUID VISCOSITY AND OTHER PRECURSOR PROPERTIES

(75) Inventors: Shinichiro Hayashi, Osaka (JP); Larry D. McMillan; Carlos A. Paz de Araujo, both of Colorado Springs, CO (US)

(73) Assignees: Symetrix Corporation, Colorado Springs, CO (US); Matsushita Electric Industrial Co., Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/243,254

(22) Filed: Feb. 3, 1999

Related U.S. Application Data

(63) Continuation-in-part of application No. 09/128,058, filed on Aug. 3, 1998, now Pat. No. 6,143,063, which is a continuation-in-part of application No. 08/610,330, filed on Mar. 4, 1996, now Pat. No. 5,962,085.

(51) Int. Cl.$^7$ ............................................. H01L 21/31
(52) U.S. Cl. ...................... 438/782; 438/240; 438/396; 427/126.3
(58) Field of Search ............................. 438/3, 240, 396, 438/782; 427/126.3

(56) References Cited

U.S. PATENT DOCUMENTS

| | | | |
|---|---|---|---|
| 4,946,710 A | 8/1990 | Miller et al. | 427/126.3 |
| 5,316,579 A | 5/1994 | McMillan et al. | 118/50 |
| 5,439,845 A | * 12/1994 | Watanabe et al. | 438/396 |
| 5,456,945 A | 10/1995 | McMillan et al. | 427/252 |
| 5,466,629 A | 11/1995 | Mihara et al. | 437/60 |
| 5,468,684 A | 11/1995 | Yoshimori et al. | 437/228 |
| 5,614,252 A | 3/1997 | McMillan et al. | 427/99 |
| 5,658,387 A | 8/1997 | Reardon et al. | 118/323 |
| 5,759,923 A | 6/1998 | McMillan et al. | 438/788 |
| 6,143,063 A | * 8/1998 | Hayashi et al. | 106/287.18 |

FOREIGN PATENT DOCUMENTS

WO    WO97/16055    5/1997

OTHER PUBLICATIONS

Bornside et al., "On the modeling of spin coating," SPSE 26th Fall Symposium: Fifth International Conference on Electronic Imaging, Journal of Imaging Technology (Arlington, VA), vol. 13, p. 122–130 (Conference—Aug. 1986; Published—Aug., 1987).

* cited by examiner

Primary Examiner—David Nelms
Assistant Examiner—Reneé R. Berry
(74) Attorney, Agent, or Firm—Patton Boggs LLP

(57) ABSTRACT

A plurality of liquids, the flow of each controlled by a volumetric flowrate controller, are mixed in a mixer to form a final precursor that is misted and then deposited on a substrate. A physical property of precursor liquid is adjusted by adjusting the volumetric flowrate controllers, so that when precursor is applied to substrate and treated, the resulting thin film of solid material has a smooth and planar surface. Typically the physical property is the viscosity of the precursor, which is selected to be relatively low, in the range of 1–2 centipoise.

40 Claims, 4 Drawing Sheets

METHOD OF LIQUID DEPOSITION BY SELECTION OF LIQUID VISCOSITY AND OTHER PRECURSOR PROPERTIES

RELATED APPLICATIONS

This application is a continuation-in-part of copending U.S. patent application Ser. No. 09/128,058 filed Aug. 3, 1998, now U.S. Pat. No. 6,143,063, which is itself a continuation-in-part of U.S. patent application Ser. No. 08/610,330 filed Mar. 4, 1996, now U.S. Pat. No. 5,962,085.

BACKGROUND OF THE INVENTION

1. Field of the Invention

The invention relates to the fabrication of integrated circuits, and in particular to a method of improving the deposition of materials during the fabrication of integrated circuits by adjusting a physical property of a precursor liquid.

2. Statement of the Problem

The manufacture of integrated circuits entails series of numerous steps in which thin layers of materials are sequentially deposited, patterned and etched to form the various components of the circuit. Therefore, to utilize a material in an integrated circuit it is necessary to be able to make a high quality thin film of the material. It is essential that the quality must be high not just from a macroscopic viewpoint, but, since the individual components of an integrated circuit are microscopic, the film must also be of high quality when examined on the microscopic level.

One of the problems associated with integrated circuit manufacture is that it is difficult to make high quality thin films of some materials, particularly complex materials such as layered superlattice materials. Often the best methods known to make these materials are complex, inefficient or unreliable. Also, the methods of deposition of various materials vary, and this lack of uniformity causes interruptions and inefficiency in the overall manufacturing process.

One category of common deposition methods is liquid deposition, in which a precursor liquid of the material to be deposited is applied to an underlying substrate. The precursor may be a simple solution of the material to be deposited dissolved in a solvent. More typically, the precursor is a solution of one or more chemical precursor species that are reacted on the substrate after the precursor liquid is applied. After a coating of precursor liquid has been applied, it is usually treated to form a solid layer of desired material.

In general, the quality of the deposited solid layer of material depends, among other factors, on the properties of the liquid coating of precursor. Some of the many properties of the liquid coating that influence the integrated circuit manufacturing include: the concentration of material or chemical precursor species in the liquid coating; the thickness of the liquid coating; and the coverage of the underlying substrate by the liquid coating. For example, usually good step coverage of a substrate by an overlying solid layer is desired. At the same time, it is often important for the deposited solid layer of material to fill all the depressions and steps in the underlying substrate and present a uniformly smooth and planar surface. In current manufacturing processes the combination of good step coverage and a smooth planar surface are achieved by using a chemical mechanical polishing ("CMP") process step after formation of the solid film. This can be the source of problems in the manufacturing process because the CMP step not only adds to the complexity and expense of the manufacturing process, but it also causes particle formation. Particles formed in the CMP process are difficult to entirely remove and can seriously degrade the integrated circuit. A related problem in current manufacturing processes is that some otherwise practical deposition methods cannot be used to deposit layers of certain solid materials because the ensuing CMP process leads to insurmountable problems.

The quality of the applied precursor liquid coating and the resulting layer of solid material are also influenced by the deposition method and conditions. For example, if a misted deposition method is used to apply the coating of precursor liquid, the flow rate of mist and the particle size of the mist influence the qualities of the liquid coating. At the same time, the physical qualities of the precursor liquid influence the efficacy of a given deposition apparatus to apply a liquid coating of desired qualities on the substrate. A problem in current manufacturing methods is that otherwise practical deposition methods cannot be used to deposit layers of certain materials because the quality of the precursor liquid is not suitable for operation with a given type of deposition apparatus.

3. Solution to the Problem

The invention solves the problems by selectively and systematically adjusting the physical properties of the precursor liquids to replace one or more conventional integrated circuit processing steps. In one preferred embodiment, the viscosity or other related physical property is selected so that the precursor fills depressions in the substrate and at the same time provides a smooth planar surface, thereby eliminating the need for a CMP process. In another embodiment a first precursor having a first viscosity or other related physical property is deposited followed by the deposition of a second precursor having a second viscosity or other related physical property. In this embodiment, preferably both the first and second precursors are precursors for forming essentially the same predetermined material.

The invention also solves the above problems by providing a method of fabricating a thin film of a solid material in which a physical property of a liquid precursor is changed during the step of depositing the precursor on a substrate. The physical property can be changed in steps or continuously. The liquid precursor can be dried between the changing steps or only after both the original precursor and the changed precursor are applied.

The invention also solves the above problems by providing an apparatus for forming a thin film of a solid material having two liquid sources and a means for mixing the two liquids in a continuous and controlled manner just prior to the step of depositing the liquids.

The invention provides a method of fabricating a thin film of solid material having a planarized thin film surface, the method comprising steps of: providing a substrate having a substrate surface including non-planarized areas; providing a precursor liquid for forming the layer of solid material, the precursor liquid having a viscosity of 5 centipoise or less; applying the precursor liquid to the substrate; and treating the precursor liquid on the substrate to form the thin film of solid material having the planarized thin film surface. Preferably, the viscosity does not exceed 2 centipoise, and most preferably the viscosity is between 1 centipoise and 2 centipoise. Preferably, the thin film of solid material comprises a metal oxide, such as a layered superlattice material, silicon dioxide, or a silicon glass. Preferably, the precursor liquid includes a compound selected from the group consisting of alkoxides, carboxylates, and combinations thereof. Preferably, the precursor includes a metal compound, and preferably the metal compound is selected from the group consisting of metal 2-ethylhexanoates and metal 2-methoxyethoxides. Preferably, the precursor liquid comprises a solvent and the solvent is selected from the group consisting of alcohols, aromatic hydrocarbons, and esters. Preferably, the step of applying comprises spin-coating a thin film of the precursor liquid on the substrate. Alternatively, the step of providing a substrate comprises placing a substrate inside an enclosed deposition chamber; and the step of applying comprises the steps of: producing a mist of the precursor liquid, and flowing the mist through the deposition chamber to form the precursor liquid on the substrate.

The invention also provides a method of fabricating a thin film of solid material comprising steps of: providing a substrate and a precursor liquid suitable for forming a thin film of the solid material upon application to a substrate and treatment; applying the precursor liquid to the substrate; changing a physical property of the precursor liquid subsequent to the step of applying; subsequent to the step of changing, continuing to apply to the substrate the precursor liquid having the changed physical property; and treating the precursor liquid on the substrate surface to form the thin film of solid material. Preferably, the method further includes the step of drying the precursor liquid on the substrate between the steps of applying and continuing to apply. Preferably, the steps of changing and continuing to apply are repeated at least once. Preferably, the step of changing is performed at the same time as the step of continuing to apply. Preferably, the step of changing is performed continuously for a predetermined time. Preferably, the physical property is viscosity, the surface tension between the precursor liquid and the substrate surface, density, heat capacity, the heat of vaporization, or vapor pressure.

In a further aspect, the invention also provides a method of fabricating a thin film of solid material comprising the steps of: providing a substrate; providing a precursor liquid; adjusting a physical property of the precursor liquid while applying the precursor liquid to the substrate; and treating the precursor liquid on the substrate surface to form the thin film of solid material.

In another aspect, the invention provides a method of fabricating a thin film of solid material comprising steps of: providing a substrate, a first liquid, and a second liquid; flowing the first liquid through a first fluid flow controller and the second liquid through a second fluid flow controller; mixing the first liquid with the second liquid in amounts determined by the first and second fluid flow controllers to form a precursor liquid; applying the precursor liquid to the substrate; and treating the precursor liquid on the substrate surface to form the thin film of solid material. Preferably, the method further includes the step of adjusting the first fluid flow controller to change the flow of the first liquid through the first fluid flow controller during the step of applying. Preferably, the at least one of the fluid flow controllers is a volumetric flowrate controller. Preferably, the thin film of solid material comprises a metal oxide, such as a layered superlattice material, silicon dioxide, or a silicon glass. Preferably, the precursor includes any of the compounds and solvents mentioned above. Preferably, the step of treating comprises a process selected from the group consisting of: exposing to vacuum, exposing to ultraviolet (UV) and/or infrared (IR) radiation, electrical poling, drying, heating, baking, rapid thermal processing, and annealing.

The invention also provides apparatus for fabricating a thin film of solid material, the apparatus comprising: a source of a first liquid, a source of a second liquid, and a mist generator; a first volumetric flowrate controller connected between the source of a first liquid and the mist generator and a second volumetric flowrate controller connected between the source of a second liquid and the mist generator; a deposition chamber in fluidic communication with the mist generator; and an exhaust assembly in fluidic communication with the deposition chamber. Preferably, the apparatus further includes a mixing chamber between the volumetric flowrate controllers and the mist generator. Preferably, the first liquid is a solvent and the second liquid is a compound selected from the group consisting of alkoxides, carboxylates, and combinations thereof.

The invention not only permits relatively simple changes in deposition parameters to replace relatively complex conventional integrated fabrication process, but results in integrated circuit materials having better electrical properties. Preferably, the variations from flatness of the surface of a thin film made according to the invention, prior to patterning, are 5% or less of the total thickness of the layer. Most preferably, the variations from flatness are 3% or less of the total thickness, and in routine uses of the invention there often are no variations more than 1% of the total thickness. Numerous other features, objects and advantages of the invention will become apparent from the following description when read in conjunction with the accompanying drawings.

DETAILED DESCRIPTION OF THE PREFERRED EMBODIMENT

1. Overview

Figure 1:
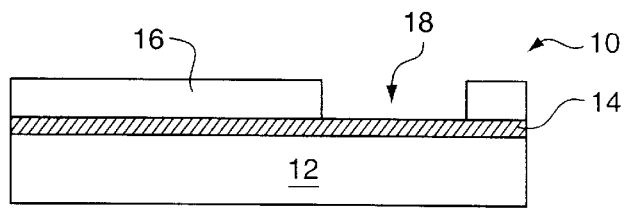
FIG. 1 shows a cross-sectional view of an intermediate stage of a portion of an integrated circuit fabricated according to the invention.

In a misted deposition process, a precursor liquid for a solid material is prepared, a mist is generated from the liquids, and the mist is flowed through a deposition chamber where it is deposited on a substrate to form a liquid coating of the mist on the substrate. The coating and substrate are then treated by such processes as UV and/or IR curing, evaporation in a vacuum, and baking, and then annealed to form a layer of the desired solid material. Basic misted deposition apparati and processes are described in detail in U.S. Pat. No. 5,456,945 issued Oct. 10, 1995 to McMillan et al., U.S. Pat. No. 5,759,923 issued Jun. 2, 1998 to McMillan et al., and U.S. patent application Ser. No. 08/971,799, which are incorporated by reference as though fully disclosed herein, as well as in numerous other publications, so they will only be described herein sufficiently to describe the invention.

As is conventional in the art, in this disclosure, the term "substrate" is used in a general sense where it includes one or a number of layers of material, such as layer 14 in FIGS. 1–7, on which another layer of solid material may be deposited, and also in a particular sense in which it refers to a wafer 12, generally formed of silicon, gallium arsenide, glass, ruby, or other material known in the art, on which the other layers are formed. Unless otherwise indicated, in this specification, it means any integrated circuit layer on which a thin film material is deposited.

Terms of orientation, such as "above", "top", "upper", "below", "bottom", and "lower" herein mean relative to the substrate 12, 102, 381 in FIGS. 1, 9, and 11, respectively. That is, if a second element is "above" a first element, it means it is farther from the substrate 12,102 or 381; and if it is "below" another element, then it is closer to the substrate 12, 102 or 381 than the other element. The long dimension of substrate 102 defines a plane that is considered to be a "horizontal" plane herein, and directions perpendicular to this plane are considered to be "vertical".

The precursor liquid solution is preferably obtained by preparing precursors for each element using alkoxide chemistry, carboxylic acid chemistry, or other wet chemistry techniques, which lead to a common solvent. Preferred solvents are xylenes, n-butyl acetate, n-octane, and 2-methoxyethanol. The solution having that common solvent is preferably used as the sole source for the entire deposition process. However, the invention also contemplates using multiple precursor sources in parallel. In particular, other sources may be used in parallel for doping or modifying the final desired solid material. For example, another source may be used for doping silicate glass with boron.

For solid materials comprising metal oxide compounds, precursor liquids generally include a metal compound in a solvent, such as sol-gel precursor formulations, which in general are comprised of metal-alkoxides in an alcohol solvent, and metallorganic precursor formulations, sometimes referred to as MOD formulations, which in general comprise a metal-carboxylate formed by reacting a carboxylic acid, such as 2-ethylhexanoic acid, with a metal or metal compound in a solvent, combinations thereof, as well as many other precursor formulations. The preferred solvents include methyl ethyl ketone, isopropanol, methanol, tetrahydrofuran (THF), xylene, n-butyl acetate, hexamethyldisilazane (HMDS), octane, 2-methoxyethanol, and ethanol. An initiator, such as methyl ethyl ketone (MEK), may be added just before misting. A more complete list of solvents and initiators as well as specific examples of metal compounds are included in U.S. Pat. No. 5,614,252 issued Mar. 25, 1997 to McMillan et al.

The term "physical property" means any property that can be measured macroscopically and characterizes the physical state of the material, such as viscosity, wetting property, i.e., how effectively the precursor wets the substrate to which it is to be applied, surface tension, density, heat capacity, heat of vaporization, vapor pressure, etc. It does not include properties that only can be determined by microscopic measurements, such as the stoichiometry of a chemical compound.

The term "planarized" means that a surface is flat within 5% of its thickness. That is, in a planarized layer, any variations from flatness in the surface of a layer, e.g., depressions or elevations, are 5% or less of the total thickness of the layer. Thus, "non-planarized" means that on the surface of a layer there is at least one elevation or depression that rises or falls by an amount that is more than 5% of the thickness of the layer.

The term "thin film" herein means a thin film of a thickness appropriate to be used in an integrated circuit. Such thin films are less than 1 micron in thickness, and generally are in the range of 20 nanometers (nm) to 500 nm. It is important to distinguish this term from the same term, i.e., "thin film", as used in essentially macroscopic arts, such as optics, where "thin film" means a film over 1 micron, and usually from 2 to 100 microns. Such macroscopic "thin films" are hundreds to thousands of times thicker than integrated circuit "thin films", and are made by entirely different processes that generally produce cracks, pores, and other imperfections that would be ruinous to an integrated circuit but are of no consequence in optics and other macroscopic arts.

The term "mist" as used herein is defined as fine drops or particles of a liquid and/or solid carried by a gas. The term "mist" includes an aerosol, which is generally defined as a colloidal suspension of solid or liquid particles in a gas. The term mist also includes a fog, as well as other nebulized suspensions of the precursor liquid in a gas. Since the above terms and other terms that apply to suspensions in a gas have arisen from popular usage, the definitions are not precise, overlap, and may be used differently by different authors. For example, "vapor" when used in its technical sense, means an entirely gasified substance, and in this sense would not be included in the definition of "mist" herein. However, "vapor" is sometimes used in a non-technical sense to mean a fog, and in this case would be included in the definition of "mist" herein. In general, the term aerosol is intended to include all the suspensions included in the text *Aerosol Science and Technology*, by Parker C. Reist, McGraw-Hill, Inc., New York, 1983. The term "mist" as used herein is intended to be broader than the term aerosol, and includes suspensions that may not be included under the terms aerosol, vapor, or fog.

The term "electrical" herein, when referring to either the "electrical acceleration" or the "electrical charging" of the mist particles is intended to include such aspects based on either electrostatic or electromagnetic principles or both.

Figure 2:
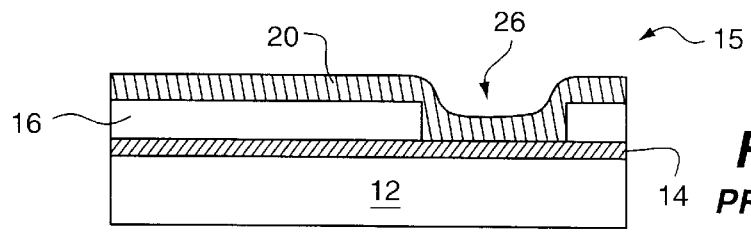
FIG. 2 shows a cross-sectional view of a portion of a prior art integrated circuit in which an additional layer is deposited on a partially formed integrated circuit as shown in FIG. 1 by a conventional process resulting in a depressed region in the layer surface.
Figure 3:
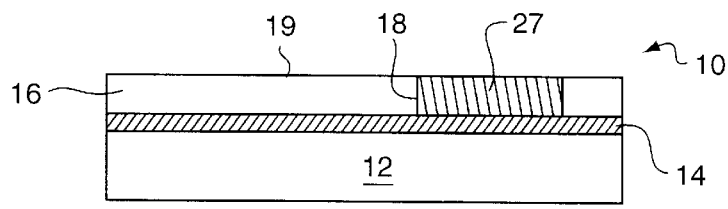
FIGS. 3 and 4 show cross-sectional views of further stages in the fabrication process according to the invention of the portion of the integrated circuit of FIG. 1.
Figure 4:
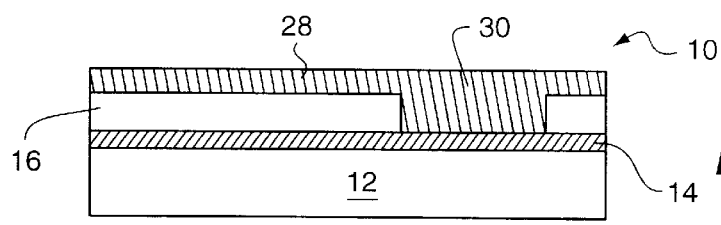
Figure 5:
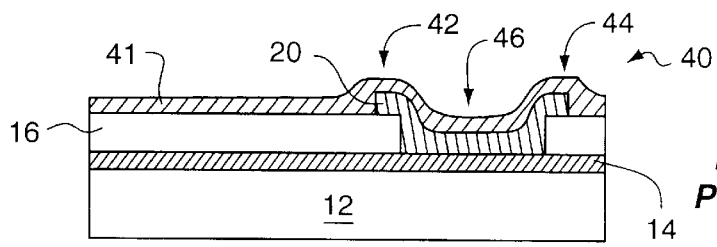
FIG. 5 depicts a cross-sectional view of a portion of a prior art integrated circuit in which a lower layer is patterned and etched and then covered with an upper layer in a conventional process, resulting in an upper layer conforming to the shape of the lower layer, having raised regions and a depressed region.

The utility of the invention compared to the prior art is illustrated with the aid of FIGS. 1–7. FIG. 1 shows a cross-sectional view of an intermediate stage of a generalized fabrication method of a portion 10 of an integrated circuit. As depicted in FIG. 1, a layer 14 is formed on an underlying substrate 12 of portion 10, and then a layer 16 is formed on layer 14. Layer 16 is patterned and etched to form an opening 18. Preferably, layer 14 is a metal, such as platinum, and layer 16 is an insulator, such as spin-on-glass (SOG). FIG. 2 shows a portion 15, similar to portion 10, in which a layer 20 is formed on layer 16 and in opening 18. The prior art method used to form layer 20 results in layer 20 conforming to opening 18 and having a depressed region 26. The prior art method uses a precursor liquid for layer 20 having a relatively high viscosity value, for example, 7–8 centipoise, and results in formation of a nonplanar surface as depicted in FIG. 2. In contrast, FIGS. 3 and 4 shows further stages in the fabrication of portion 10, in which a layer 30 is formed by a method according to the invention using a precursor liquid having a relatively low viscosity value, for example, 1–2 centipoise.

According to the invention, either a one-step process, a multi-step process, or a continuously variable process may be used to create the integrated circuit portion 10 shown in FIG. 4. Preferably, the a multi-step process utilizing two steps is used. In this two-step process, a first precursor is deposited to form the layer 27 which fills in the opening 18. The first precursor has a viscosity value of 5 centipoise or less, preferably less than 3 centipoise, and most preferably 2 centipoise or less. Preferably, layer 27 is dried, and then a second precursor is deposited to form layer 27. The second precursor preferably is formulated to form essentially the same material as the material of layer 27, but the viscosity is adjusted to a viscosity higher than 5 centipoise, and preferably 7 centipoise or higher. In FIG. 3, the first layer 27 is shown as only just filling the opening 18 and is not distributed on surface 19, however, the invention also contemplates that a small amount of the precursor that is used to form layer 27 will stick to surface 19 and, after drying, a very thin layer of the desired predetermined material 27 will remain on surface 19. In any case, after the deposition and drying of layer 28, a dried film of desired predetermined material within a desired predetermined thickness range covers integrated circuit portion 10. The dried films 27 and 28 are then annealed to form layer 30. In the annealing process the two films 27 and 28 merge to form the final thin film of desired predetermined material 30. In the one-step process the step of FIG. 3 is eliminated, and a precursor having a viscosity value of 5 centipoise or less, preferably less than 3 centipoise, and most preferably, 2 centipoise or less, is deposited then dried and annealed to form layer 30 in one deposition step. In both embodiments, the method of the invention results in eliminating or significantly reducing any depression in the layer 30 corresponding to opening 18. Layer 30 in FIG. 4 serves the same integrated circuit function as layer 20 in FIG. 2. Typically layer 30 comprises the same solid material as layer 20, or it may be different even though it serves the same function in the integrated circuit. The important point is that the viscosity or some other physical property or properties of the precursor liquid used to form layer 30 was selected to allow layer 30 to fill completely the opening 18.

A feature of the invention is that it has been found that good results can be obtained without a drying step between the use of precursors having different physical properties. In particular, the physical properties of the precursor can be changed in a continuous and gradual manner from one property to another. For example, as the opening 27 is filled, the viscosity can be gradually changed from about 2 centipoise to about 7 centipoise, while continuing the deposition. The increased viscosity precursor then sticks and accumulates on the substrate, including over the layer 27. After deposition of both layers 27 and 28, they are dried and annealed to form layer 30. The invention contemplates that other multiple step processes, between the two-step process and the continuous process, such as three or more discrete steps, may be used.

Figure 6:
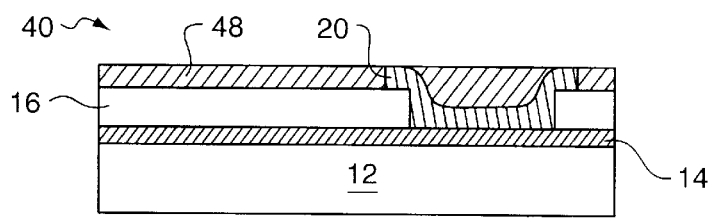
FIGS. 6 and 7 show cross-sectional views of further stages in another embodiment of a fabrication process according to the invention having a lower layer as in the prior art integrated circuit of FIG. 5, but in which the upper layer was formed using a method according to the invention, resulting in an upper layer having a substantially planar surface.
Figure 7:
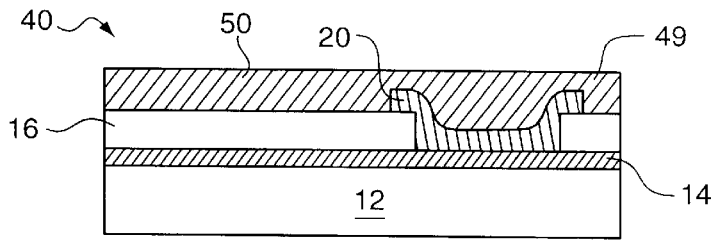

FIG. 7 is a cross-sectional view of a portion 40 of an integrated circuit, in which a layer 20 is patterned, etched and then covered with a layer 41. Layer 20 may comprise a solid material that is not amenable to deposition using the inventive method. For example, layer 20 may comprise a metal electrode or local interconnect layer that can practically be formed only by sputtering of a target. As a result, a depression 26 as in FIG. 2 characterizes the surface of layer 20 in FIG. 5. When layer 41 is deposited, using a prior art method, layer 41 conforms to the shape of layer 20, and raised regions 42 and 44 and a depressed region 46 result. In contrast, FIG. 7 shows that if layer 50 is deposited according to the invention to cover the same layer 20 of FIG. 5, then the resulting surface of layer 50 is substantially planar, and the raised regions 42 and 44 and the depressed region 46 of FIG. 6 are eliminated or significantly reduced. Again, FIGS. 6 and 7 illustrate a two-step process of forming the layer 50 in which layer 48 is formed by a low viscosity precursor and layer 49 is formed by a higher viscosity precursor, and then layer 50 is formed in the anneal process. Similarly to the discussion above, the step of FIG. 6 can be eliminated and layer 50 can also be formed by a one-step deposition process. Alternatively, a continuously variable process or a multi-step process utilizing three or more steps may be used.

During, after, or both during and after applying the precursor liquid, the liquid coating is treated to form a thin layer of solid material 30, 50 on the substrate. In this context, "treated" means any one or a combination of the following: exposed to vacuum, UV and/or IR radiation, electrical poling, drying, and heating, including baking and annealing. In the preferred embodiment, UV radiation is optionally applied to the precursor solution during deposition. The UV radiation is preferably also applied after deposition. After deposition, the liquid coating is preferably exposed to vacuum for a period, then is baked and then annealed. The preferred process of implementing the invention includes: deposition of the misted precursor liquid directly on the substrate; dissociation of the organics contained in the precursor that do not form part of the desired solid material; and removal of the solvent and organics or other fragments primarily after the liquid coating is on the substrate. However, in another aspect the invention also contemplates a process in which the final desired chemical compound or an intermediate compound is separated from the solvent and organics before the liquid coating is applied, and the final desired chemical compound or an intermediate compound is deposited on the substrate. In both aspects, preferably one or more bonds of the precursor pass through to the final solid layer. After the formation of the desired layer of solid material 30, 50, the integrated circuit is continued to completion. This generally includes patterning of the layer 30, 50.

In the discussion above, the material 30, 50 is preferably a complex compound, which is defined as a compound containing at least two metals. Examples of such compounds are the layered superlattice materials and the $ABO_3$ type perovskites. Preferably, the layer 30, 50 forms a portion of an active component of the integrated circuit. The term "active" when applied to an electronic element in an integrated circuit, means an element that alters its state in response to some electrical stimulus. This is to distinguish elements that form important functions in the electrical circuit, and therefore must be of high and reproducible quality, from elements that are removed from the integrated circuit before its completion or which merely serve to separate portions of the circuit or act as a packaging element for the circuit, which elements do not need to be of nearly as high and reproducible quality.

2. Detailed Description

Figure 8:
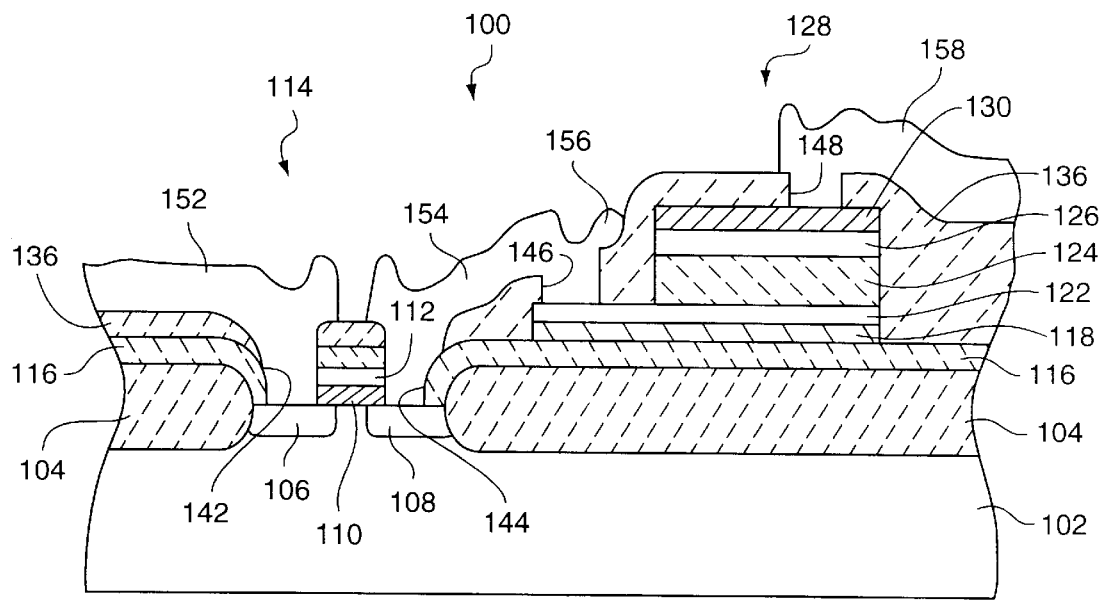
FIG. 8 shows a cross-sectional view of a portion of a prior art integrated circuit showing an exemplary nonvolatile ferroelectric random access memory ("FeRAM") cell or dynamic random access memory ("DRAM") cell fabricated using the prior art.

In FIG. 8 there is shown a cross-sectional view of an exemplary nonvolatile ferroelectric random access memory ("FeRAM") cell or dynamic random access memory ("DRAM") cell 100 fabricated using the prior art. FIG. 9. depicts an FeRAM or DRAM cell 200 fabricated according to the invention. The general manufacturing steps for fabricating integrated circuits containing MOSFETs and memory capacitor elements are described in U.S. Pat. No. 5,466,629 issued Nov. 14, 1995 to Mihara et al., and U.S. Pat. No. 5,468,684 issued Nov. 21, 1995 to Yoshimori et al., which are hereby incorporated by reference as if fully disclosed herein. General fabrication methods have been described in other references also. Therefore, the elements of the circuits in FIGS. 8–11 will be simply identified here. For the sake of clarity, identical elements depicted in FIGS. 8–11 are identified with the same reference numerals.

In FIG. 8, a field oxide region 104 is formed on a surface of a silicon substrate 102. A source region 106 and a drain region 108 are formed separately from each other within silicon substrate 102. A gate insulating layer 110 is formed on the silicon substrate 102 between the source and drain regions 106 and 108. Further, a gate electrode 112 is formed on the gate insulating layer 110. Source region 106, drain region 108, gate insulating layer 110, and gate electrode 112 together form a MOSFET 114.

A first interlayer dielectric layer (ILD) 116 made of BPSG (Boro-phospho-silicate glass) is formed on substrate 102 and field oxide region 104. An adhesion layer 118 is formed on ILD 116. The adhesion layer 118 is made of, for example, titanium, and typically has a thickness of 20 nm. Adhesion layers, such as titanium, enhance the adhesion of the electrodes to adjacent underlying or overlying layers of the circuits.

As depicted in FIG. 8, a bottom electrode layer 122 made of platinum and having a thickness of 200 nm is deposited on adhesion layer 118. A dielectric thin film 124 is formed on bottom electrode layer 122. Preferably, dielectric thin film 124 comprises a layered superlattice material. A top electrode layer 126, made of platinum and having a thickness of 200 nm, is formed on the thin film 124. Electrode layers 122 and 126 together with thin film 124 form memory capacitor 128.

An electrically conductive diffusion barrier layer 130 is deposited on top electrode layer 126. Diffusion barrier layer 130 has a thickness in the range of 20 to 200 nm, preferably in the range of 20 to 50 nm. Layer 130 could also represent an adhesion layer, or it might not be included. Layers 118,122,124,126, and 130 are patterned, in as few as two patterning process steps, to form memory capacitor 128.

A second ILD 136 made of NSG (Nondoped silicate glass) is deposited using a prior art method to cover ILD 116 and memory capacitor 128. A PSG (Phospho-silicate glass) film or a BPSG film could also be used in layer 136. As depicted in FIG. 8, ILD 136 conforms generally to the shape of the substrate surface on which it is formed, so that the surface of ILD 136 has a raised region corresponding to the stack of patterned layers forming memory capacitor 128.

ILD 136 is patterned to form wiring holes 142, 144, 146, and 148 for electrical contacts to MOSFET 114 and ferroelectric memory capacitor 128. A metallized wiring layer is deposited, typically using a sputtering method, and etched to form local interconnect ("LI") layers Li 152,154,156, and 158. The metallized wiring layer deposited to form LI 152,154,156 and 158 preferably comprises Al—Si—Cu—Ti with a thickness of 500–900 nm. The shape and relative vertical locations of these local interconnects also conform to the shape of the substrate on which they were applied.

Figure 9:
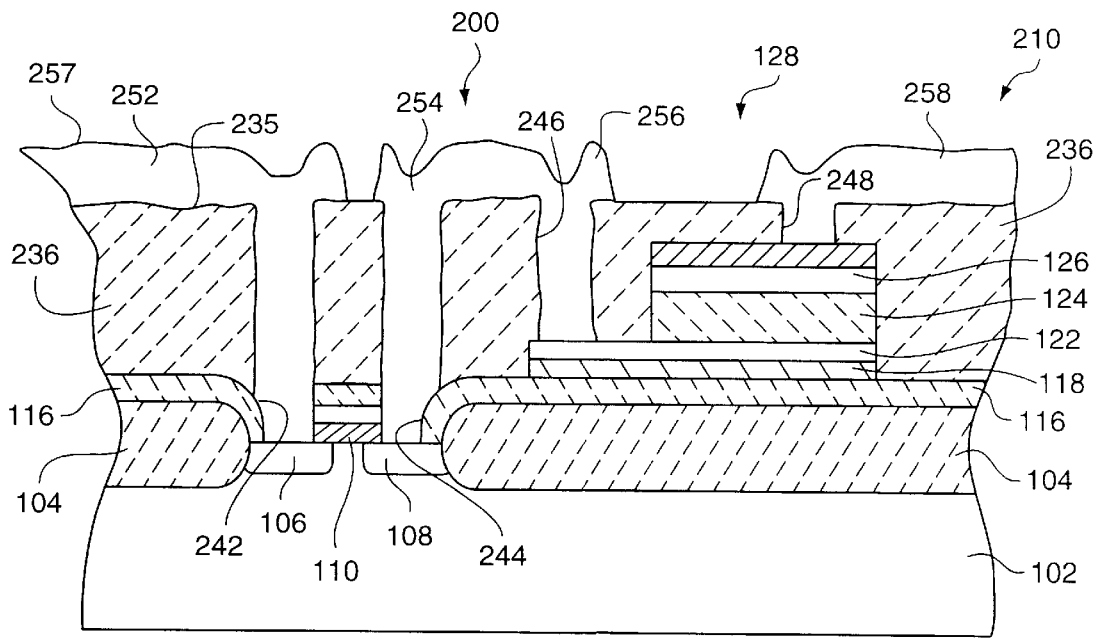
FIG. 9 depicts a cross-sectional view of FeRAM or DRAM cell fabricated according to the invention.

In FIG. 9, ILD 236, corresponding to ILD 136 of FIG. 8, was deposited according to the invention. As a result, the liquid coating of precursor for ILD 236 does not conform closely to the shape of ILD 116 and stacked capacitor 128. Instead, the liquid coating tends to fill completely the openings and depressions presented by the substrate surface. The result is that ILD 236 presents a substantially smooth and planar surface before it is patterned and etched. Preferably, the variations from flatness of the surface 235 of ILD 236, prior to patterning, are 5% or less of the total thickness of the layer. Most preferably, the variations from flatness are 3% or less of the total thickness, and in routine uses of the invention there often are no variations more than 1% of the total thickness. As discussed above with respect to FIGS. 1–7, ILD 236 may be formed by either a one-step or a two-step process. It should be noted that memory cell 200 of FIG. 9 is only one of numerous cells in integrated circuit 210 having raised and depressed regions on the surface of a wafer processed using the method of the invention. Because ILD 236 is substantially planar, the metallized wiring layer deposited to form LI 252, 254, 256, and 258 is also substantially planar. Since the Li layers are typically sputter-deposited and tend to conform to the substrate on which they are deposited, they show depressed regions corresponding to holes 242, 244, 246, and 248 even though long-through sputtering (LTS) or collimated sputtering is used in an attempt to fill them in. Nevertheless, the top surface 257 of the portion of integrated circuit 210 lies substantially in one plane.

Figure 10:
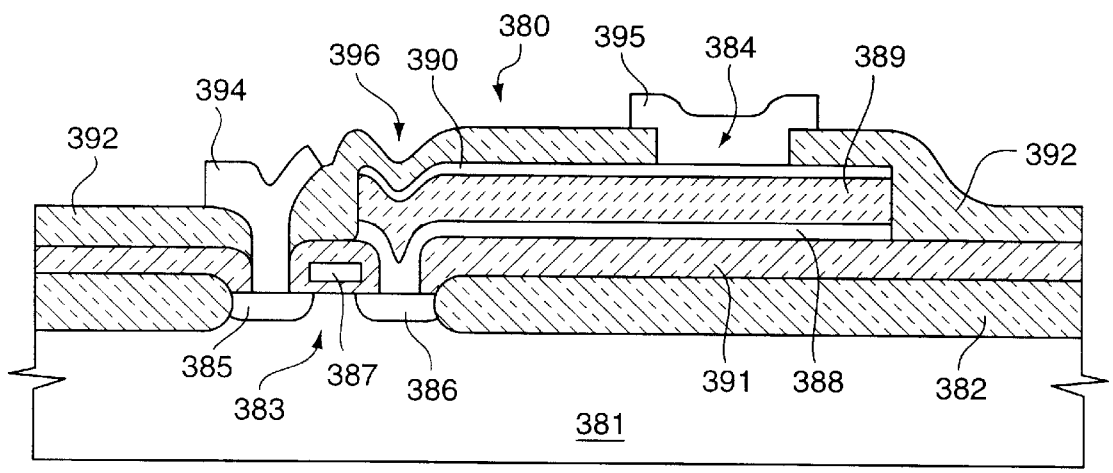
FIG. 10 depicts cross-sectional view of a prior art FeRAM or DRAM cell in which a metal oxide dielectric layer of a capacitor was formed using prior art resulting in depressed regions in the metal oxide layer and layers above it.
Figure 11:
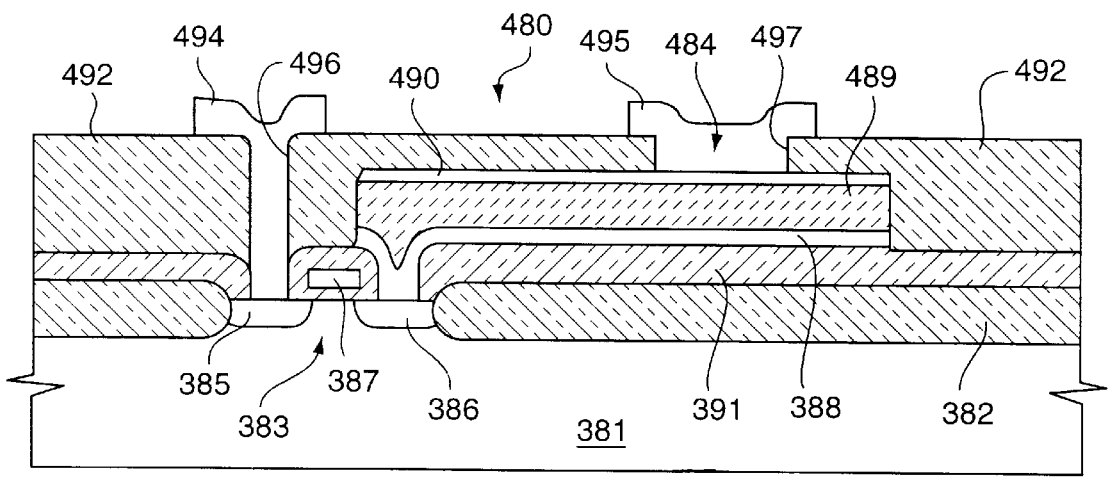
FIG. 11 depicts a cross-sectional view of a portion of a DRAM or FeRAM integrated circuit in which the metal oxide dielectric layer of the capacitor and an upper interlayer dielectric layer (ILD) were deposited using the method of the invention, resulting in smooth and planar shapes.

With the aid of FIGS. 10 and 11, the utility of using the method of the invention to deposit a metal oxide dielectric layer of a capacitor is shown. In FIG. 10, depicting prior art, the FeRAM or DRAM cell 380 is formed on a silicon substrate 381, and includes field oxide areas 382, and two electrically interconnected electrical devices, a transistor 383 and a memory capacitor 384. Transistor 383 includes a source 385, a drain 386, and a gate 387. Capacitor 384 includes first electrode 388, metal oxide dielectric thin film layer 389, and second electrode 390. ILD 391 separates the devices 383 and 384, except where drain 386 of transistor 383 is connected to first electrode 388 of capacitor 384. ILD 392 is formed to cover ILD 391 and memory capacitor 384.

Since the layer or layers of electrode 388 are typically sputter deposited, the shape of electrode 388 practically always has a depressed region corresponding to the opening to drain 386. When metal oxide material is deposited on electrode 388 using prior art methods to form dielectric layer 389, the shape of dielectric layer 389 also has a depressed region, corresponding to the depressed region of electrode 388. Similarly, electrode 390 and ILD 392 exhibit a depressed region 396 mirroring the depressed regions below. In the prior art, the only way to eliminate these depressed regions was to make one layer much thicker than desired, then use a CMP process to planarize it.

In FIG. 11, on the other hand, metal oxide dielectric layer 489 is deposited on electrode 388 using the method of the invention. As a result, the top surface of dielectric layer 489 is smooth and planar. Therefore, electrode 490 and ILD 492 are also smooth and planar above the depressed region of electrode 388. Furthermore, when ILD 492 is deposited according to the invention, its surface is uniformly planar, having no depressed region above the MOSFET 383, which is lower than memory capacitor 484. As a result, the top surfaces of Li 494 and 495 are substantially planar, although small depressions corresponding to wiring holes 496 and 497 may persist. Again, layer 489 may be formed by either a one-step, a multi-step process utilizing two or more steps, or a continuously variable process as discussed above.

Figure 12:
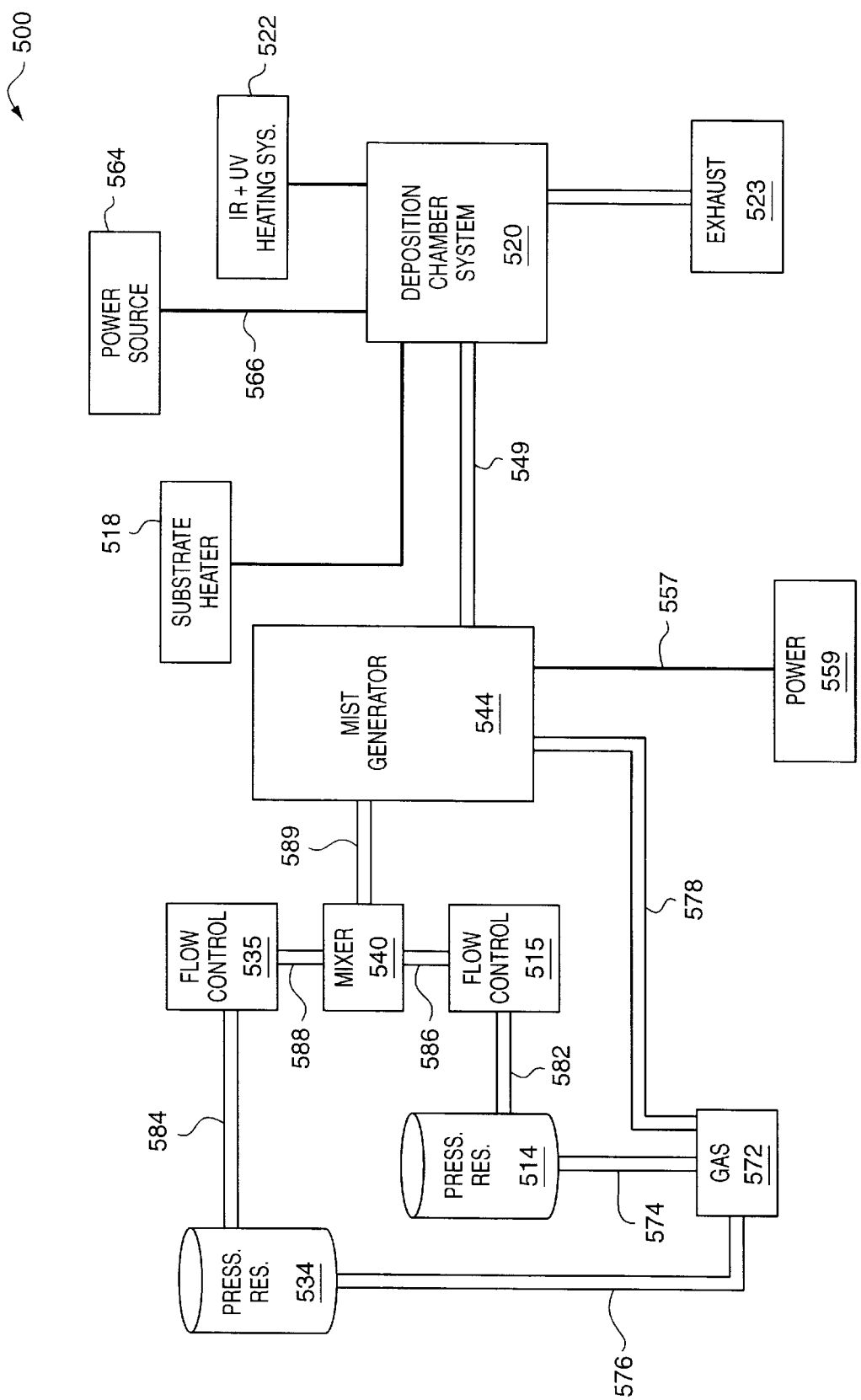
FIG. 12 illustrates a liquid source deposition system according to the invention.

FIG. 12 depicts a block diagram of a preferred misted deposition apparatus and process for forming an integrated circuit in accordance with the invention. The apparatus 500 includes: a first source of a liquid, i.e., pressurized reservoir 514, a second source of a liquid, i.e., pressurized reservoir 534; a gas system 572; volumetric flowrate controllers 515 and 535; a mixer 540; a mist generator 544; a deposition chamber system 520; an ultraviolet and infrared heating system 522; a substrate heater 518; an exhaust system 523, and mist electrical acceleration power sources 559 and 564.

As indicated in the Overview, above, in a misted deposition process, a substrate is first prepared for deposition by pretreatment. Here, "pretreatment" preferably comprises exposure to UV radiation, but may also include exposure to IR radiation, a bake at a temperature between 150° C. and 900° C., and/or exposure to vacuum. A precursor liquid for a material, such as an oxide ILD layer or a metal oxide dielectric layer, is prepared, a mist is generated from the precursor liquid, and the mist is flowed through a deposition chamber where it is deposited on a substrate to form a liquid coating on the substrate. The liquid coating and substrate are then treated by UV and/or IR curing, evaporation in a vacuum, and/or baking, and then annealed to form a layer of the desired solid material. The flow of the precursor liquid through the system is briefly described, as follows.

To begin the process, a first liquid is inserted in pressurized reservoir 514 and a second liquid is inserted in pressurized reservoir 534. The first and second liquids may be any of the precursor liquids, solvents, or initiators discussed above. The deposition chamber system 520 is being pumped down to a partial vacuum of about 70 Torr below atmospheric pressure. Gas system 572 provides pressurized gas, preferably dry nitrogen or other inert gas, via lines 574 and 576, respectively, to precursor reservoirs 514 and 534, respectively, at sufficient pressure to drive the fluid from reservoirs through their respective volumetric flowrate controllers 515 and 535, respectively. Pressurized reservoirs 514 and 534 are connected to volumetric flowrate controllers 515 and 535, respectively, via lines 582 and 584, respectively, and volumetric flowrate controllers 515 and 534, respectively, are connected to precursor mixer 540 via lines 586 and 588, respectively. Precursor mixer 540 is connected to mist generator 544 via line 589. Gas line 578 is connected between gas source 572 and mist generator 544.

As known in the fluid control art, volumetric flowrate controllers 515 and 535 are electronic devices that accurately passes a selected mass of liquid. Unlike a valve, the flow of liquid through a volumetric flowrate controller does not depend on the pressure of the fluid flow line, the viscosity of the liquid, or the numerous other parameters that can affect fluid flow. The volumetric flowrate controllers 515 and 535 are capable of accurately controlling flow of a liquid to within 2% of the selected flow rate. Preferably, the volumetric flowrate controllers 515 and 535 are both a controller model No. LV410 manufactured by ESTEC (a Japanese Corporation) and distributed in the USA by Horiba Instruments, Inc. of San Jose, Calif. This volumetric flowrate controller can control the flow of precursor into mist generator 544 from about 0.05 ccm (cubic centimeters per minute) essentially up to 1 ccm. The volumetric flowrate controllers 515 and 535 permits minute adjustments of the flow of the first and second liquids to mixer 540 and into mist generator 544 and also permits the same flow to be repeated in later runs. The use of a volumetric flowrate controllers 515 and 535 are very important to obtain repeatable deposition rate, repeatable viscosities, repeatable wetting and sticking properties, as well as other physical properties of the precursor.

Mist generator 544 may use one of several methods suitable for generating mists from liquids; for example, ultrasonic misting and venturi misting. Preferably, a venturi mist generator is used. Pressurized gas flows through gas line 578 to mist generator 544, with the gas pressure in line 578 automatically controlled. Preferably, this pressure is between 40 pounds per square inch (psi) ($2.76 \times 10^5$ Pa) and 80 psi ($5.52 \times 10^5$ Pa), and most preferably about 60 psi ($4.14 \times 10^5$ Pa). Preferably, the gas is a mixture of an inert gas, such as dry nitrogen, and an easily ionized gas, preferably oxygen or carbon dioxide, and most preferably oxygen. The oxygen is added to enhance the charging of the mist. The oxygen ionizes readily, and, since, in a gas at room temperature the gas particles are continually colliding, assists in transferring charge to the liquid mist droplets. Preferably, the gas is 1% to 15% oxygen in volume, and most preferably 5% to 10%. In the preferred embodiment process, a gas mixture of 95% dry nitrogen and 5% oxygen was used.

To begin the deposition process, volumetric flowrate controllers 515 and 535 are adjusted to provide the desired precursor to mixer 540 and thence to mist generator 544. For example, in one preferred embodiment an alkoxycarboxylate strontium bismuth tantalate (SBT) precursor is provided as the first liquid and THF is provided as the second liquid, and by adjusting flow controllers 515 and 535 sufficient THF is mixed with the SBT precursor in mixer 540 to provide a precursor with viscosity of about 2 centipoise to the mist generator 544. Hexane and/or pentane may also be used instead of THF. A mist is generated in mist generator 544 and flows into deposition chamber system 520 via conduit 549. The deposition takes place near atmospheric pressure. The pressure is automatically controlled. Preferably, the gas/mist flow through the system from line 589 through mist generator 544 is between 3 liters per minute and 8 liters per minute, and preferably about 5 liters per minute.

A power line 557 runs to mist generator 544 from power generator 559 to charge the mist, preferably by using corona discharge. The voltage applied in mist generator 544 is automatically controlled by power generator 559. The charged particles are accelerated in deposition chamber system 520 by means of a voltage applied from power source 564 via electrical cable 566. The acceleration voltage is automatically controlled. Additional oxygen or carbon dioxide may also be added if needed to assist in charging the mist.

In the preferred embodiment corresponding to the two-step process discussed in reference to FIGS. 3 and 4, after sufficient deposition has taken place to fill opening 18, the deposition is temporarily stopped by turning off flow controllers 515 and 535 and venting mist generator 544 to a precursor dump. The deposited precursor is dried in situ by applying a low vacuum and curing at about 150° C. for from 1 minute to 3 minutes and then at approximately 260° C. for 3 minutes to 5 minutes, preferably using UV and/or IR radiation as the heat source, to create layer 27. By "in situ" is meant that the substrate is not removed from the deposition chamber during this process. Then, the flow controller 535 remains off while flow controller 515 is turned on, and once a good flow of mist to the mist dump begins, the mist is once again directed to deposition chamber 520 to deposit the layer 28. After a suitable thick layer of the first liquid is deposited, the deposition is stopped again and layer 28 is formed by drying in situ as before. As an example of the continuously variable process discussed with respect to FIGS. 3 and 4 above, the deposition is not stopped after the opening 18 is filled, but instead flow controller 535 is gradually closed to cause the viscosity to increase from about 1–2 centipoise to about 7–8 centipoise. Preferably, UV radiation from heating system 522 is applied during the entire deposition process. Then, after the deposition of layers 27 and 28 is completed, the flow of mist to the deposition chamber system 520 is stopped, and the liquid coating on the substrate is preferably cured and baked in situ via UV and/or IR lamps in heating system 522. Preferably, the initial drying step takes place without breaking vacuum. This is important, because the electronic quality of the deposited layer of solid material is compromised by breaking vacuum and exposing the liquid coating to contaminants prior to drying. The substrate may also be removed from the deposition chamber and transferred to an annealing station without breaking vacuum. Additional substrates may be placed in and removed from the deposition chamber system 520 without breaking vacuum.

In the above description, two liquids in two pressurized reservoirs 514 and 534 and two volumetric flowrate controllers 515 and 535 were used. According to the invention three or more of each may be used. That is, the apparatus of the invention contemplates that a plurality of liquid sources and a plurality of volumetric flowrate controllers are used.

The above process has also been used to change the deposition rate of the precursor during deposition, preferably with a slow rate at the start to fill in the tiniest of depressions and a faster rate after the smaller depressions have been filled. This process simplifies the fabrication process since it avoids the use of several processing steps to fill the depressions and then a processing step to planarize the layer. The process has also been used with methyl ethyl ketone (MEK) as the second liquid to alter the surface tension between exhibited by the precursor, and thus to affect how well the precursor wets the substrate. Preferably, about a 50/50 combination of the first liquid and the MEK are used at the start to cause the precursor to wet the substrate well, and then the MEK is gradually decreased to zero, which increases the deposition rate. This process simplifies the fabrication process by eliminating the need for a separate adhesion layer in some cases.

Now that it has been shown that the precursor viscosity can be adjusted to simplify the integrated circuit fabrication process, it is evident that other physical parameters of the precursor can also be adjusted to improve the integrated circuit fabrication process. For example, the surface tension, the density, the heat capacity, the heat of vaporization, and the vapor pressure all can be adjusted by adjusting the precursor, solvent and/or the initiator using the liquids discussed above. All these properties can be adjusted for either the individual initial metal precursors, the solvent, and/or the initiator, separately, or for the final precursor as a whole. Each of the above physical properties effect the performance of the precursor, the reaction of the precursor to the deposition, drying, baking and annealing steps, and the final solid formed, and thus these elements of the process can be controlled and used to advantage by adjustments made to the precursor liquids.

There has been described a novel method of fabricating integrated circuit devices utilizing precursor liquids with selected physical properties, especially viscosity, in misted deposition processes. The novel method is useful for fabricating layers of essentially any type of solid material used in integrated circuits that is capable of being formed from a liquid precursor. The novel method can be used to form, among others, gate dielectric in MOSFETs, interlayer dielectric layers, silicon dioxide insulators, and capacitor dielectric in DRAMs and FeRAMs. It should be understood that the particular embodiments shown in the drawings and described within this specification are for purposes of example and should not be construed to limit the invention which will be described in the claims below. Further, it is evident that those skilled in the art may now make numerous uses and modifications of the specific embodiment described, without departing from the inventive concepts. For example, now that the advantageous use of selectively choosing physical properties of precursor liquids in integrated circuit fabrication has been disclosed, the method can be advantageously used in thin film applications other than those described. Other liquid deposition processes, different from those described above, may be used to form layers of solid material. It is clear from the above that various formulations may be used. Further, the precursors, processes and structures can be combined with conventional processes to provide variations on the processes and devices described. It is also evident that the process steps recited may in some instances be performed in a different order, or equivalent structures and processes may be substituted for the various structures and processes described. Consequently, the invention is to be construed as embracing each and every novel feature and novel combination of features present in and/or possessed by the precursors, precursor formation processes, electronic devices, and electronic device fabrication methods and apparatus described.

What is claimed is:

1. A method of fabricating a thin film of solid material having a planarized thin film surface, said method comprising steps of:

providing a substrate having a substrate surface including non-planarized areas;

providing a precursor liquid for forming said layer of solid material, said precursor liquid having a viscosity of 5 centipoise or less;

applying said precursor liquid to said substrate; and treating said precursor liquid on said substrate to form said thin film of solid material having said planarized thin film surface.

2. A method as in claim 1 wherein said viscosity does not exceed 2 centipoise.

3. A method as in claim 2 wherein said viscosity is between 1 centipoise and 2 centipoise.

4. A method as in claim 1 wherein said thin film of solid material comprises a metal oxide.

5. A method as in claim 4 wherein said metal oxide comprises layered superlattice material.

6. A method as in claim 1 wherein said thin film of solid material comprises silicon dioxide.

7. A method as in claim 1 wherein said thin film of solid material comprises a silicon glass.

8. A method as in claim 1 wherein said precursor liquid includes a compound selected from the group consisting of alkoxides, carboxylates, and combinations thereof.

9. A method as in claim 1 wherein said precursor liquid comprises a metal compound.

10. A method as in claim 9 wherein said metal compound is selected from the group consisting of metal 2-ethylhexanoates and metal 2-methoxyethoxides.

11. A method as in claim 1 wherein said precursor liquid comprises a solvent and said solvent is selected from the group consisting of alcohols, aromatic hydrocarbons, and esters.

12. A method as in claim 1 wherein said step of applying comprises spin-coating a thin film of said precursor liquid on said substrate.

13. A method as in claim 1 wherein:
said step of providing a substrate comprises placing a substrate inside an enclosed deposition chamber; and
said step of applying comprises the steps of: producing a mist of said precursor liquid, and flowing said mist through said deposition chamber to form said precursor liquid on said substrate.

14. A method of fabricating a thin film of solid material comprising steps of:
providing a substrate and a source of a first precursor liquid suitable for forming a thin film of said solid material upon application to a substrate and treatment;
applying said precursor liquid to said substrate;
subsequent to said step of applying, changing said liquid precursor source to provide a second precursor liquid suitable for forming essentially the same solid material as said first precursor liquid but having a physical property different from said first precursor liquid;
subsequent to said step of changing, continuing to apply said second precursor liquid having said changed physical property directly onto said first precursor liquid or said solid material formed from said first precursor liquid; and
treating said precursor liquid on said substrate surface to form said thin film of solid material.

15. A method as in claim 14 and further including the step of drying said precursor liquid on said substrate between the steps of applying and continuing to apply.

16. A method as in claim 14 wherein said steps of changing and continuing to apply are repeated at least once.

17. A method as in claim 14 wherein said step of changing is performed at the same time as said step of continuing to apply.

18. A method as in claim 17 wherein said step of changing is performed continuously for a predetermined time.

19. A method as in claim 14 wherein said physical property is viscosity.

20. A method as in claim 14 wherein said physical property is the surface tension between said precursor liquid and said substrate surface.

21. A method as in claim 14 wherein said physical property is density.

22. A method as in claim 14 wherein said physical property is heat capacity.

23. A method as in claim 14 wherein said physical property is the heat of vaporization.

24. A method as in claim 14 wherein said physical property is vapor pressure.

25. A method as in claim 14 wherein said step of applying comprises spin-coating a thin film of said precursor liquid on said substrate.

26. A method as in claim 14 wherein:
said step of providing a substrate comprises placing a substrate inside an enclosed deposition chamber; and
said step of applying comprises the steps of: producing a mist of said precursor liquid, and flowing said mist through said deposition chamber to form said precursor liquid on said substrate.

27. A method of fabricating a thin film of solid material comprising the steps of: providing a substrate;
providing a source of a precursor liquid suitable for forming a thin film of said solid material;
adjusting said source of a precursor liquid to change a physical property of said precursor liquid without essentially changing the solid material it is suitable for forming while applying said precursor liquid to said substrate; and
treating said precursor liquid on said substrate surface to form said thin film of solid material.

28. A method of fabricating a thin film of solid material comprising steps of:
providing a substrate, a first liquid, and a second liquid different from said first liquid;
flowing said first liquid through a first fluid flow controller and said second liquid through a second fluid flow controller;
mixing said first liquid with said second liquid in amounts determined by said first and second fluid flow controllers to form a precursor liquid;
applying said precursor liquid to said substrate; and
treating said precursor liquid on said substrate surface to form said thin film of solid material.

29. A method as in claim 28 and further including the step of adjusting said first fluid flow controller to change the flow of said first liquid through said first fluid flow controller during said step of applying.

30. A method as in claim 28 wherein said at least one of said fluid flow controllers is a volumetric flowrate controller.

31. A method as in claim 28 wherein said thin film of solid material comprises a metal oxide.

32. A method as in claim 28 wherein said thin film of solid material comprises layered superlattice material.

33. A method as in claim 28 wherein said thin film of solid material comprises silicon dioxide.

34. A method as in claim 28 wherein said thin film of solid material comprises a silicon glass.

35. A method as in claim 28 wherein said precursor liquid comprises a metal compound.

36. A method as in claim 28 wherein said precursor liquid includes a compound selected from the group consisting of alkoxides, carboxylates, and combinations thereof.

37. A method as in claim 28 wherein said precursor liquid comprises a solvent and said solvent is selected from the group consisting of alcohols, aromatic hydrocarbons, and esters.

38. A method as in claim 37 wherein said solvent is selected from the group consisting of xylenes, 2-methoxyethanol, n-butyl acetate, 1,4-dioxane, methanol and methyl ethyl ketone.

39. A method as in claim 28 wherein said step of treating comprises a process selected from the group consisting of: exposing to vacuum, exposing to ultraviolet radiation, exposing to infrared radiation, electrical poling, drying, heating, baking, rapid thermal processing, and annealing.

40. A method as in claim 28 wherein said step of treating comprises maintaining a sub-atmospheric pressure in a deposition chamber containing said substrate.

* * * * *